(12) United States Patent
Levine et al.

(10) Patent No.: US 8,654,232 B2
(45) Date of Patent: Feb. 18, 2014

(54) NIGHT VISION CMOS IMAGER WITH OPTICAL PIXEL CAVITY

(75) Inventors: Peter Alan Levine, West Windsor, NJ (US); Rui Zhu, Skillman, NJ (US); John Robertson Tower, Yardley, PA (US)

(73) Assignee: SRI International, Menlo Park, CA (US)

( * ) Notice: Subject to any disclaimer, the term of this patent is extended or adjusted under 35 U.S.C. 154(b) by 148 days.

(21) Appl. No.: 13/215,799

(22) Filed: Aug. 23, 2011

(65) Prior Publication Data

US 2012/0050554 A1 Mar. 1, 2012

Related U.S. Application Data

(60) Provisional application No. 61/376,758, filed on Aug. 25, 2010.

(51) Int. Cl.
*H04N 3/14* (2006.01)
*H01L 31/062* (2012.01)

(52) U.S. Cl.
USPC .......................................... 348/308; 257/292

(58) Field of Classification Search
USPC .......... 348/294, 302, 308; 257/291, 292, 294; 250/208.1
See application file for complete search history.

(56) References Cited

U.S. PATENT DOCUMENTS

| | | | | |
|---|---|---|---|---|
| 3,815,977 | A * | 6/1974 | Vasiliev et al. | 359/834 |
| 3,873,829 | A * | 3/1975 | Evrard et al. | 250/214 LA |
| 4,782,382 | A * | 11/1988 | Godfrey | 257/434 |
| 5,281,804 | A * | 1/1994 | Shirasaki | 250/214.1 |
| 5,315,128 | A * | 5/1994 | Hunt et al. | 257/16 |
| 5,389,797 | A * | 2/1995 | Bryan et al. | 257/21 |
| 6,055,262 | A * | 4/2000 | Cox et al. | 372/96 |
| 7,982,177 | B2 * | 7/2011 | Nozaki et al. | 250/239 |
| 7,989,859 | B2 * | 8/2011 | Mao et al. | 257/292 |
| 8,035,181 | B2 * | 10/2011 | Ishimura et al. | 257/436 |
| 8,053,821 | B2 * | 11/2011 | Moon et al. | 257/292 |
| 8,183,656 | B2 * | 5/2012 | Okamoto et al. | 257/432 |
| 8,378,400 | B2 * | 2/2013 | Masuoka et al. | 257/292 |
| 2010/0032659 | A1 * | 2/2010 | Yoshida | 257/40 |
| 2011/0045869 | A1 * | 2/2011 | Nishizawa | 455/556.1 |
| 2011/0254115 | A1 * | 10/2011 | Shih et al. | 257/432 |

* cited by examiner

*Primary Examiner* — Timothy J Henn
(74) *Attorney, Agent, or Firm* — Marger Johnson & McCollom PC

(57) ABSTRACT

A pixel design is disclosed. The pixel includes a photo-sensitive element. A first reflective layer substantially overlies the photo-sensitive element. A second reflective layer substantially underlies the photo-sensitive element and forms a cavity with the first reflective layer that is non-resonant with respect to photon absorption. An aperture is formed in either the first reflective layer or the second reflective layer. When electromagnetic radiation enters the aperture, the first reflective layer and the second reflective layer are configured to reflect the electromagnetic radiation substantially toward each other until substantially absorbed in the cavity.

18 Claims, 2 Drawing Sheets

Top illuminated P-channel CMOS pixel with multipass cavity with two mirrors and

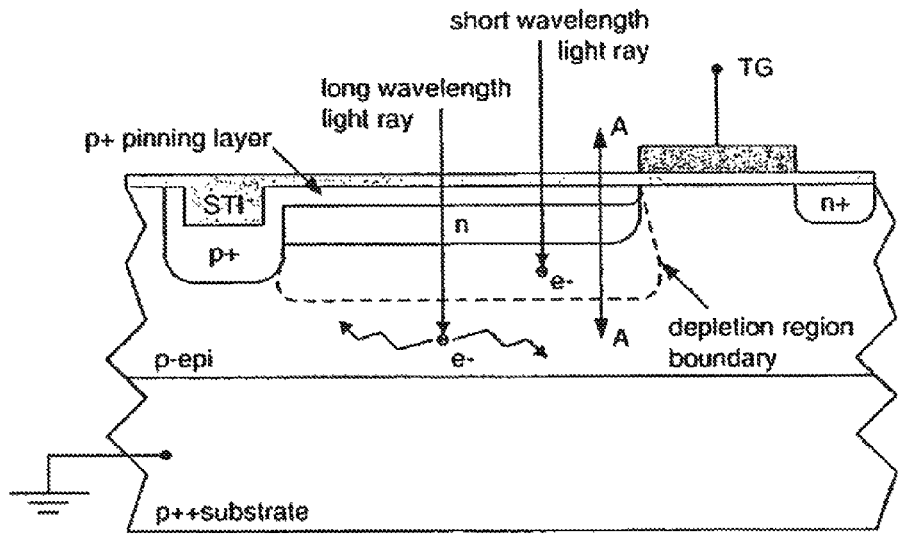
Figure 1. Prior art, application US20070108371, CMOS charge transfer pixel with n-channel charge transfer using signal electrons.
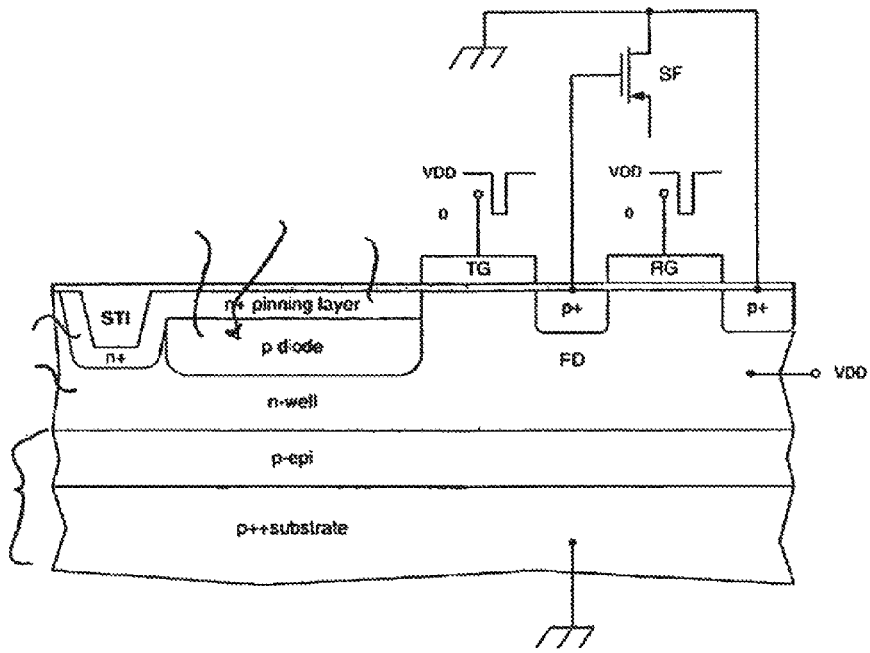
Figure 2. Prior art, application US20070108371, CMOS charge transfer pixel with p-channel charge transfer using signal holes.

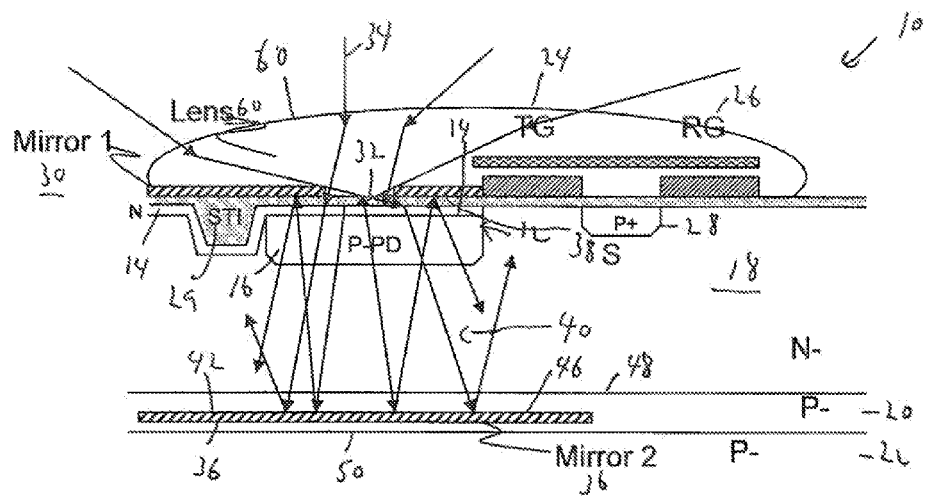
Figure 3. Top illuminated P-channel CMOS pixel with multipass cavity with two mirrors and microlens.
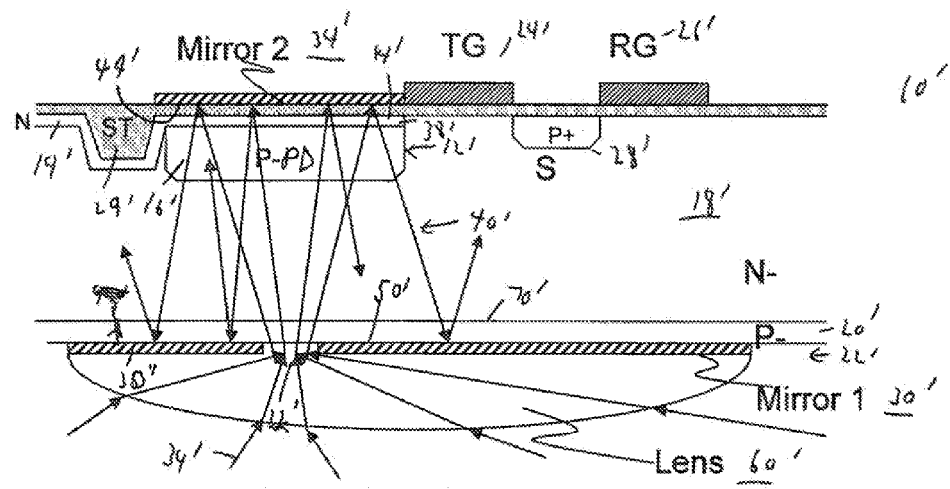
Figure 4. Back illuminated P-channel CMOS pixel with multipass cavity with two mirrors and microlens.

NIGHT VISION CMOS IMAGER WITH OPTICAL PIXEL CAVITY

CROSS-REFERENCE TO RELATED APPLICATION

This application claims the benefit of U.S. provisional patent application No. 61/376,758 filed Aug. 25, 2010, the disclosure of which is incorporated herein by reference in its entirety.

FIELD OF THE INVENTION

The invention relates generally to imaging devices. More specifically, the invention relates to CMOS charge transfer pixels for night vision applications.

BACKGROUND OF THE INVENTION

Generally, an image sensor is a semiconductor device for converting an optical image into an electric signal. There are a number of different types of semiconductor-based imagers, including charge coupled devices (CCDs), photodiode arrays, charge injection devices, hybrid focal plane arrays, etc. The various types of image sensors may be broadly categorized as charge coupled devices (CCD) and complementary metal oxide semiconductor (CMOS) image sensors.

In recent years, there has also been increased interest in applying CMOS active pixel sensors for night vision applications, such as night vision sensors used by soldiers. The night vision band of electromagnetic radiation corresponds to wavelengths in the range of 600 nm to 1000 nm.

Current night vision sensors employ intensifier tube technology. Intensifier tubes use photo cathodes having quantum efficiency (QE) of about 30-40 percent in the night vision band. Dark current shot noise is negligible over the military temperature range. Intensifier tubes are capable of producing useful images with overcast starlight illumination.

Reasons for replacing intensifier tubes include their large size and high cost. In contrast, CMOS imaging devices are of generally low cost and small size, have direct electronic output, and have a potentially higher mean time between failures (MTF).

Unfortunately, conventional CMOS imagers cannot match the low light performance of intensifier tubes because room temperature dark current is too high for devices thick enough to have high near infra-red (IR) quantum efficient (QE) needed for night vision.

To achieve overcast starlight operation without cooling, a CMOS imaging device should have at least the following properties (or better): (1) a total output noise<1 erms, (2) high QE in the 600-1000 nm range; and (3) dark current<1 e/pixel/frame up to 60 degrees Celsius. Read noise of<1 erms is presently attainable with conventional CMOS imaging technology. High near IR QE may be attainable using thick silicon to provide adequate absorption of long wavelength light. Typically, silicon thickness needs to be in the range of 15 um to 25 um. Pixels are generally 4 um to 8 um square. U.S. Patent Application publication No. US 2007/0108371 (hereinafter "the '371 application") discloses how to achieve the needed dark current level with a relatively thin effective photon absorption and dark current generating region. This approach results in lower QE in the 600-1000 nm wavelength range than is possible with thicker silicon absorption in a CMOS pixel.

FIGS. 1 and 2 show an n-channel charge transfer pixel and a p-channel charge transfer pixel as disclosed in the '371 application, respectively. A lower dark current is asserted in the '371 application for the p-channel pixel. This is of interest for night vision applications. The '371 application describes a p-channel process which reduces many sources of dark current but not bulk dark current. Unfortunately, the lowest possible dark current limit results from bulk silicon. The '371 application claims to have dark current sufficiently low for uncooled night vision use. Unfortunately, but the absorption region for photons in such devices is too thin to have high QE at near IR wavelengths needed for night vision. The thickness of the imager is limited by the depth of an n-well implant. If the n-well were to be formed in another way so that it may be deeper, bulk dark current would increase because of the increase in silicon volume.

U.S. Pat. No. 6,433,326 (hereinafter "the '326 patent") asserts that dark current reduction may be achieved by minimizing detector area with respect to pixel pitch and specific readout for a CMOS/CCD hybrid process imager. In the '326 patent, a detector is made as small as possible and surrounded by a guard ring to remove excess dark current and a microlens array is used to increase fill factor. Light from an objective lens is focused to a small spot by the microlens array on each detector. Unfortunately, there is no discussion of silicon volume in the '326 patent. Therefore, the bulk silicon dark current issue remains.

Accordingly, what would be desirable, but has not yet been provided, is CMOS active pixel sensor design that reduces silicon volume per pixel while still providing efficient absorption of light in the wavelength range from 600 to 1000 nm that also reduces bulk dark current.

SUMMARY OF THE INVENTION

The above-described problems are addressed and a technical solution achieved in the art by providing a pixel that includes a photo-sensitive element, a first reflective layer substantially overlying the photo-sensitive element, and second reflective layer substantially underlying the photo-sensitive element and forming a cavity with the first reflective layer that is non-resonant with respect to photon absorption. An aperture is formed in either the first reflective layer or the second reflective layer. When electromagnetic radiation enters the aperture, the first reflective layer and the second reflective layer are configured to reflect the electromagnetic radiation substantially toward each other until substantially absorbed in the cavity.

According to an embodiment of the present invention, a layer of a first conductivity type may underly the photo-sensitive element. A layer of a second conductivity type may underly the layer of a first conductivity type. The electromagnetic radiation within the cavity may be substantially absorbed by at least one of the layer of the first conductivity type and the photo-sensitive element.

According to an embodiment of the present invention, the second reflective layer may substantially underly or at least partially extend into the layer of the second conductivity type.

According to an embodiment of the present invention, the first reflective layer and the second reflective layer may be mirrors, or they may each comprise at least two materials having mismatching indices of refraction. The mirrors may be substantially flat or substantially curved.

According to an embodiment of the present invention, a distance between the first reflective layer and the second reflective layer may be large compared to a wavelength of electromagnetic radiation entering the aperture. A diameter of the aperture may be small with respect to pixel pitch.

According to an embodiment of the present invention, the pixel may further include a lens substantially overlying the aperture when the aperture is formed in the first reflective layer and substantially underlying the second reflective layer when the aperture is formed in the second reflective layer and configured to focus light to an area within at least one of the photo-sensitive element and the layer of the first conductivity type. The second reflective layer may be formed by employing an epitaxial layer overgrowth (ELO) method. The second reflective layer may be embedded in a buried oxide (BOX) layer when the pixel is initially formed from at least one ultra-thin silicon-on-insulator wafer. The photo-sensitive element may be a photodiode, a pinned photodiode, a photogate, or a charge coupled device (CCD). In an embodiment, the photo-sensitive element may be of the second conductivity type. The first conductivity type may be p-type and the second conductivity type may be n-type or vice-versa.

According to an embodiment of the present invention, the pixel may be formed in a CMOS process. The pixel may be back illuminated or front illuminated.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which:

FIG. 1 shows a hardware block diagram of an n-channel charge transfer pixel as disclosed in the '371 application;

FIG. 2 shows a hardware block diagram of an p-channel charge transfer pixel as disclosed in the '371 application;

FIG. 3 is a hardware block diagram of a top-side illuminated (TSI) p-channel CMOS charge transfer pixel, according to an embodiment of the present invention; and FIG. 4 is a hardware block diagram of a bottom-side illuminated (BSI) p-channel CMOS charge transfer pixel, according to an embodiment of the present invention.

It is to be understood that the attached drawings are for purposes of illustrating the concepts of the invention and may not be to scale.

DETAILED DESCRIPTION OF THE INVENTION

Certain embodiments of the present invention pertain to pixel designs. A pixel comprising a small volume of detecting silicon contained in an optical cavity that provides multiple light passes through the detecting silicon over a wide range of wavelengths. The optical cavity may be formed by flat or curved mirrors to reduce pixel-to-pixel cross-talk and improve QE. The optical cavity is effectively non-resonant with respect to photon absorption because the thickness of the silicon is large compared to the wavelength of light being detected.

An aperture is provided in one of the mirrors for light to enter the cavity. The shape of the mirrors may be curved to minimize loss of light reflected back to the aperture and reduce cross talk between pixels. Each pixel may have an associated microlens capable of focusing light falling on the lens area to a small spot which fits within the cavity aperture to improve QE. In an embodiment, the diameter of the aperture is significantly small with respect to the pixel pitch.

FIG. 3 is a hardware block diagram of a top-side illuminated (TSI) p-channel CMOS charge transfer pixel, according to an embodiment of the present invention. The CMOS pixel 10 may include a pinned photodiode detector (PPD) 12 having an overlying n+ pinning layer 14 and an underlying p-type burried channel region 16 formed within an n– well 18 on a p– epitaxial layer 20. The p– epitaxial layer 20 may be formed on a removable p++ epitaxial substrate 22. Other portions of the CMOS pixel 10 adjacent the pinned photodiode 12 may include a transfer gate 24, also labeled TG, a reset gate 26, also labeled RG, and an intervening sense node 28, also labeled S. A shallow tranch isolation (STI) region 29 may overlay the n+ type pinning layer 14 configured to electrically isolate the pinned photodiode 12 from the gates 24, 26.

A first mirror 30 may be formed overlying the STI region 29 and having an aperture 32 formed therein to permit light 34 to enter the CMOS pixel 10. The first mirror 30 may be flat or curved, and may be substantially or completely reflective at least on its inner surface 38. In another embodiment, the first mirror 30 may be made of multiple refractive layers of material such that at least one of the layers has an index of refraction such that light is substantially reflected towards an internal cavity 40. In an embodiment, the first mirror substantially overlies the PPD 12. In an embodiment, the diameter of the aperture 32 is significantly small with respect to the pixel pitch.

A second mirror 36 may be formed at least partially embedded in the p– epitaxial layer 20 and configured to reflect light 34 reaching the second mirror 36 from the overlying aperture 32. The second mirror 36 may be flat or curved, and is substantially or completely reflective at least on its inner surface 42. In an embodiment, the first mirror 30 substantially underlies the PPD 12 and preferably the transfer gate 24, the reset gate 26, and the intervening sense node 28. In another embodiment, the second mirror 36 may be made of multiple refractive layers of material such that at least one of the layers has an index of refraction such that light is substantially reflected towards the internal cavity 40. The mirrors 24, 30 are shown to be flat in FIG. 1, but they may also have other shapes. The specific shape of the mirrors may be chosen to reduce light from exiting from the pixel 10 via the aperture 32.

In one embodiment, the second mirror 36 may be embedded in the p– epitaxial layer 20 by epitaxial lateral overgrowth (ELO) or other means. The second mirror 36 may be placed in the p– epitaxial layer 20 outside of the n– well 18 so that excess holes of (in the p-channel case) dark current generated at the second mirror-to-silicon interface 46 do not enter the n– well 18. Holes are repelled by the relatively positive n– well 18. The n-well edge 48 and the embedded second mirror 36 are closely spaced so that photo holes generated in the p– epitaxial layer 20 are not lost by removal as n-well current.

In an embodiment, the second mirror 36 may be deposited proximal to a back surface 50 of the imager which may be accessed by thinning of the p++ epitaxial substrate 22. A starting wafer from which the p++ epitaxial substrate 22 is formed may be thinned so the back surface 50 is close to the bottom edge of the n– well 18 but still in the p– epitaxial layer 20. In another embodiment, the second mirror 36 may be applied to the back surface 50 of the CMOS pixel 10. In another embodiment, the second mirror 36 may be embedded in a buried oxide (BOX) layer (not shown) if starting wafers employ ultra-thin silicon-on-insulator (UTSOI) technology.

The mirrors 30, 36 form the non-resonant (optical) cavity 40 for providing substantially full reflection of light between the mirrors 30, 36 and minimizing light escaping from the aperture 32 such that substantially all of the light 34 is absorbed in the intervening layers of the CMOS pixel 10. This multi-pass light reflection effect substantially reduces bulk dark current shot noise.

A microlens 60 may formed substantially overlying the mirror 30 having the aperture 32 and preferably overlying the transfer gate 24, the reset gate 26, and the intervening sense node 28. The microlens 60 is configured to focus all or most the input light 34 through the small aperture 32 in the first mirror 30. The microlens 60 may be operable with an f1.0 to f1.4 objective lens for typical night vision applications. The light 34 is collected over the entire microlens 60 and focused on the relatively small aperture 32 so light efficiently enters the cavity 40. One method for implementing the microlens 60 is to employ a MEMS processes to form a Fresnel lens. This approach may use high refractive index materials if required.

As described above, in an embodiment, the second mirror 36 may be embedded in the p– epitaxial layer 20 using an ELO method. The second mirror 36 may formed by embedded reflective material deposited during growth of epitaxial silicon used to form the basis for the imager and its pixels. A p-channel pixel is known to have lower dark current than n-channel pixels. Because the buried channel region 16 is p-type, it needs to be in an n-type substrate. Since the standard substrate for CMOS circuits is p-type, a deep n-well 18 may be formed during fabrication and the p-type burried channel region 16 is formed in the n-well 18. Electrons generated in the p– epitaxial layer 20 below the n-well 18 are not collected by the buried channel pinned photo diode detector (PPD) 12. The second mirror 36 may be embedded just below n-well 18 so that excess dark current causes by the second mirror 36 is not collected by the potential well under the n+ pinning layer 14. The second mirror 36 is as close as possible to the edge of n-well 18 so that minimum photo charge generated in the p– epitaxial layer 20 is lost to the reverse biased n-well 18.

In operation, some of the light 34 in the form of photons is initially absorbed in the cavity 40 on the first pass; some of the light 34 is reflected back from the second mirror 36 then absorbed; and some of the light 34 is reflected multiple times between the first mirror 30 and the second mirror 36 before being absorbed. As a result, effective absorption length increases without increasing material thickness to improve QE without a dark current increase associated with a material volume increase.

FIG. 4 is a hardware block diagram of a bottom-side illuminated (BSI) p-channel CMOS charge transfer pixel, according to an embodiment of the present invention. The CMOS pixel 10' is similar in structure to the TSI CMOS pixel 10' of FIG. 3, except that the locations of the first mirror 30', the second mirror 34', and the microlens 60' are reversed relative to the layers of the CMOS pixel 10'. The first mirror 30' is formed with an accompanying aperture 32' substantially underlying the pixel 10' on a back surface 50' or embedded in the p– epitaxial layer 20' which may be accessed by thinning and substantially removing the p++ epitaxial substrate 22'. In an embodiment, the first mirror 30' substantially underlies the PPD 12' and preferably the transfer gate 24', the reset gate 26', and the intervening sense node 28'. In an embodiment, the diameter of the aperture 32' is significantly small with respect to the pixel pitch.

The first mirror 30' may be flat or curved, and is substantially or completely reflective at least on its inner surface 42'. In another embodiment, the first mirror 30' may be made of multiple refractive layers of material such that at least one of the layers has an index of refraction such that light is substantially reflected towards an internal cavity 40'. The first mirror 30' may be embedded in the p– epitaxial layer 20' by epitaxial lateral overgrowth (ELO) or other means. In an embodiment, the first mirror 30' may be placed in the p– epitaxial layer 20' outside of the n-well 18' so excess hole (p-channel case) dark current generated by ELO does not enter the n-well 18'. Holes are repelled by the relatively positive n-well 18'. In an embodiment, the n-well edge 70' and embedded first mirror 30' may be closely spaced so that photo holes generated in the p– epitaxial layer 20' wafer are not lost by removal as n-well current. In one embodiment, the first mirror 30' may be deposited proximal to a back surface 50' of the pixel 10' after thinning. In another embodiment, the first mirror 30' may be embedded in a BOX layer if starting wafers employ UTSOI technology.

A second mirror 36' may be formed substantially overlying the PPD 12' and configured to reflect light 34' reaching the second mirror 36' from the underlying aperture 32' in the first mirror 30'. The second mirror 36' may be flat or curved, and is substantially or completely reflective at least on its inner surface 44'. In another embodiment, the second mirror 36' may be made of multiple refractive layers of material such that at least one of the layers has an index of refraction such that light is substantially reflected towards the internal cavity 40'.

The microlens 60' may formed substantially overlying the first mirror 30' having the aperture 32' and preferably overlying the transfer gate 24', the reset gate 26', and the intervening sense node 28'. The microlens 60' is configured to focus all or most the input light 34' through the small aperture 32' in the first mirror 30'. The microlens 60' may be operable with an f1.0 to f1.4 objective lens for typical night vision applications. The light 34' is collected over the entire microlens 60' and focused on the relatively small mirror aperture 32' so light efficiently enters the optical cavity. One method for implementing the microlens 60' is to employ a MEMS processes to form a Fresnel lens. This approach may use high refractive index materials if required.

In operation, light 34' in the form of photons is initially absorbed in the cavity 40' on the first pass; some of the light 34' is reflected back from the second mirror 36' then absorbed; and some of the light 34' is reflected multiple times between the first mirror 30' and and the second mirror 36' before being absorbed. As a result, effective absorption length increases without increasing material thickness to improve QE without a dark current increase associated with a material volume increase.

In the BSI embodiment of FIG. 4, the first mirror 30' may be embedded in the p– epitaxial layer 20' close to the n-well 18' for the same reason as the embedded second mirror 36 of FIG. 3 for the TSI embodiment. The p– epitaxial layer 20' under the n-well 18' may be thin to prevent loss of signal holes repelled by the n-well bias.

Embodiments of the present invention are configured to reduce dark current for night vision CMOS imagers. This eliminates the need for cooling which is not practical for soldier applications. More particularly, embodiment of the present invention are configured to increase absorption for TSI and BSI CMOS pixels having a relatively low volume of bulk silicon. The disclosed embodiments focus on the case where a p-channel PPD 12, 12' is used. This architecture is emphasized because p-channel PPD imagers are is capable of lower dark current than n-channel PPD imagers. However, the basic concept of the internal cavity 40, 40' described hereinabove applies to n-channel PPD pixels as well.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:
1. A pixel, comprising:
   a photo-sensitive element;

a first reflective layer substantially overlying the photo-sensitive element;

a second reflective layer substantially underlying the photo-sensitive element and forming a cavity with the first reflective layer that is non-resonant with respect to photon absorption, wherein a distance between the first and second layers is larger than a wavelength of light being detected; and an aperture formed in one of the first reflective layer and the second reflective layer, wherein when electromagnetic radiation enters the aperture, the first reflective layer and the second reflective layer are configured to reflect the electromagnetic radiation substantially toward each other until substantially absorbed in the cavity.

2. The pixel of claim 1, further comprising:

a layer of a first conductivity type underlying the photo-sensitive element; and a layer of a second conductivity type underlying the layer of a first conductivity type, wherein the electromagnetic radiation within the cavity is substantially absorbed by at least one of the layer of the first conductivity type and the photo-sensitive element.

3. The pixel of claim 2, wherein the second reflective layer substantially underlies or at least partially extends into the layer of the second conductivity type.

4. The pixel of claim 1, wherein the first reflective layer and the second reflective layer are mirrors.

5. The pixel of claim 4, wherein the mirrors are substantially flat.

6. The pixel of claim 4, wherein the mirrors are substantially curved.

7. The pixel of claim 1, wherein the first reflective layer and the second reflective layer each comprise at least two materials having mismatching indices of refraction.

8. The pixel of claim 1, wherein a distance between the first reflective layer and the second reflective layer is large compared to a wavelength of electromagnetic radiation entering the aperture.

9. The pixel of claim 1, wherein a diameter of the aperture is small with respect to pixel pitch.

10. The pixel of claim 2, further comprising a lens substantially overlying the aperture when the aperture is formed in the first reflective layer and substantially underlying the second reflective layer when the aperture is formed in the second reflective layer and configured to focus light to an area within at least one of the photo-sensitive element and the layer of the first conductivity type.

11. The pixel of claim 1, wherein the second reflective layer is formed by employing an epitaxial layer overgrowth (ELO) method.

12. The pixel of claim 1, wherein the second reflective layer is embedded in a buried oxide (BOX) layer when the pixel is initially formed from at least one ultra-thin silicon-on-insulator wafer.

13. The pixel of claim 1, wherein the photo-sensitive element is one of a photodiode, a pinned photodiode, a photogate, or a charge coupled device (CCD).

14. The pixel of claim 13, wherein the photo-sensitive element is of the second conductivity type.

15. The pixel of claim 14, wherein the first conductivity type is p-type and the second conductivity type is n-type.

16. The pixel of claim 14, wherein the first conductivity type is n-type and the second conductivity type is p-type.

17. The pixel of claim 1, wherein the pixel is formed in a CMOS process.

18. The pixel of claim 17, wherein the pixel is back illuminated or front illuminated.

* * * * *